(12) United States Patent
Johnson et al.

(10) Patent No.: US 7,771,560 B2
(45) Date of Patent: Aug. 10, 2010

(54) METHODS TO PREVENT ECC (EDGE CHIPPING AND CRACKING) DAMAGE DURING DIE PICKING PROCESS

(75) Inventors: James R. Johnson, Colchester, VT (US); Timothy C. Krywanczyk, Essex Junction, VT (US); Matthew R. Whalen, Chelsea, VT (US)

(73) Assignee: International Business Machines Corporation, Armonk, NY (US)

( * ) Notice: Subject to any disclaimer, the term of this patent is extended or adjusted under 35 U.S.C. 154(b) by 402 days.

(21) Appl. No.: 11/863,356

(22) Filed: Sep. 28, 2007

(65) Prior Publication Data

US 2009/0084499 A1  Apr. 2, 2009

(51) Int. Cl.
*B32B 38/10* (2006.01)
(52) U.S. Cl. ........................ 156/344; 156/584; 438/464; 438/976

(58) Field of Classification Search ................ 156/344, 156/584; 438/464, 976
See application file for complete search history.

(56) References Cited

U.S. PATENT DOCUMENTS

| 5,098,501 | A | * | 3/1992 | Nishiguchi ............... 156/275.5 |
| 5,589,029 | A | | 12/1996 | Matsui et al. |
| 6,386,815 | B1 | | 5/2002 | Tawara |
| 6,555,418 | B2 | | 4/2003 | Kurosawa et al. |
| 6,709,543 | B2 | | 3/2004 | Kurosawa |
| 2006/0237142 | A1 | * | 10/2006 | Park et al. ................... 156/584 |

* cited by examiner

*Primary Examiner*—Mark A Osele
(74) *Attorney, Agent, or Firm*—Scully, Scott, Murphy & Presser, P.C.; William H. Steinberg, Esq.

(57) ABSTRACT

A method for preventing edge chipping and cracking damage encountered by semiconductor chips in a die picking operation during separation from an adhesive sheet. Also provided is a device for preventing potential edge chipping and cracking damage encountered by a semiconductor chip during die picking processes.

18 Claims, 2 Drawing Sheets

INITIAL EJECT PIN POSITION

INITIAL EJECT PIN POSITION

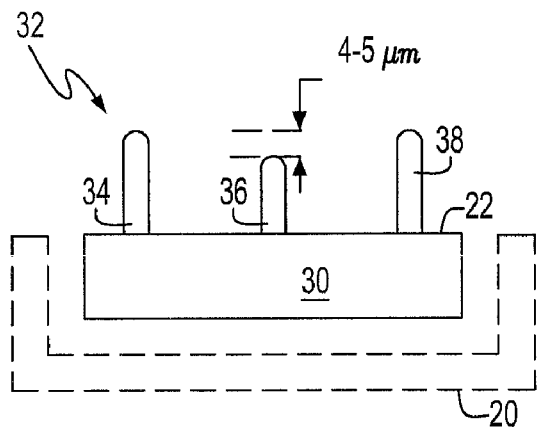
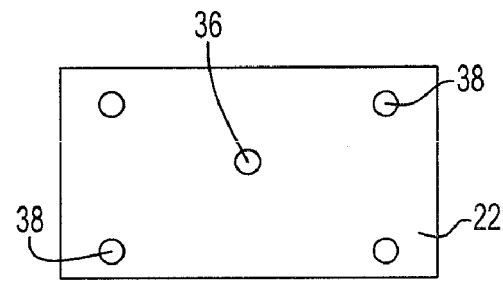
FIG. 2　　　　　　　　　FIG. 3
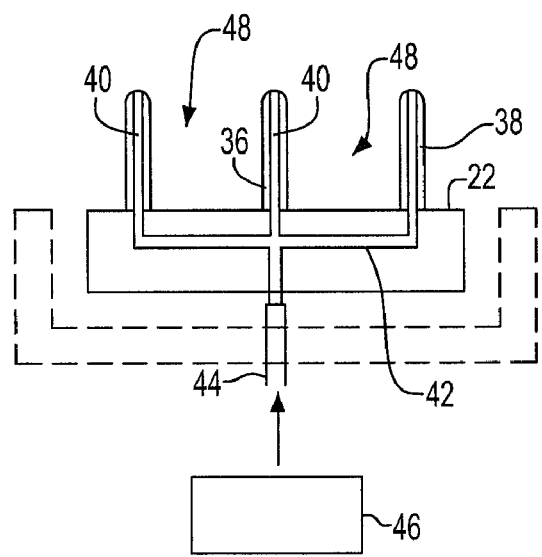
FIG. 4
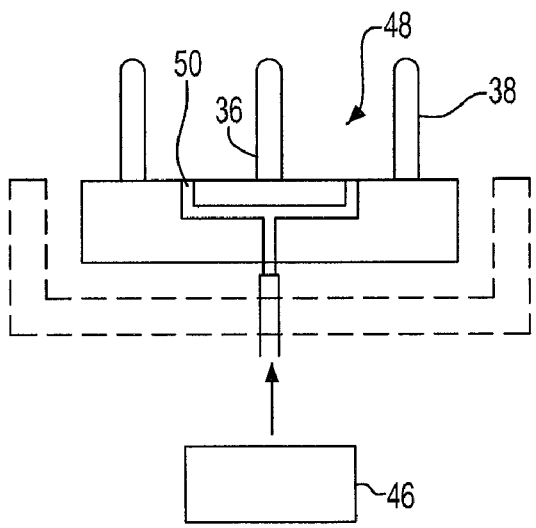
FIG. 5

METHODS TO PREVENT ECC (EDGE CHIPPING AND CRACKING) DAMAGE DURING DIE PICKING PROCESS

BACKGROUND OF THE INVENTION

1. Field of the Invention

The present invention relates to a method for preventing edge chipping and cracking damage encountered by semiconductor chips in a die picking operation during separation from an adhesive sheet. Moreover, the invention also relates to a device for preventing potential edge chipping and cracking damage encountered by a semiconductor chip during die picking processes.

Currently in the technology, in effectuating semiconductor chip pickup processes separating chips which adhere to an adhesive shorter film, initially a semiconductor wafer, which may or may not have operative components provided thereon, is diced and divided along suitable dicing lines and division lines in order to form a plurality of semiconductor chips, while adhered to the adhesive sheet. Normally, these semiconductor chips are adhered to the underlying adhesive sheet or film prior to and during dicing from the wafer, and each of the individual semiconductor chips is then subsequentially picked from the adhesive tape and separated therefrom in order to enable the individualized semiconductor chips to be further processed, as is well-known in the technology. This further processing may entail, for example, conveying the semiconductor chips subsequent to their separation from the adhesive sheet to being mounted on a lead frame or TIB tape, and then effecting a mounting process for sealing the product into a package so as to complete an electronic or semiconductor device.

In the present technology, the individual diced chips are normally separated from the underlying adhesive tape on which the chips are positioned through the employment, for example, of suctioning devices or collets, which may include an aspirating or suctioning nozzle located above the chips, and which will lift the semiconductor chips in sequence so as to enable separation thereof from the underlying adhesive sheet. However, this known method and apparatus may, at times, result in the adhesive sheet tearing, and possibly remain adherent to the semiconductor chips, particularly to the chip edges, so as to cause the thereby engaged semiconductor chip to possibly tilt or be misplaced and subjected to edge chipping or cracking. This may then render the semiconductor chip defective and unable to be employed in an electronic package.

Consequently, pursuant to advances in the technology, methods and semiconductor chip pickup devices have been developed in which chucks or jigs are positioned beneath an adhesive sheet or tape having the diced semiconductor chips located therein, and wherein the device incorporates upstanding pin members engaging the lower surface of the adhesive sheet. The pin members are adapted to be displaced upwardly while, concurrently, a vacuum or subatmospheric pressure is applied below the adhesive sheet, which will tend to cause the sheet to be adhered to the upper ends of the pins and during a subsequent downward motion of the chuck or jig cause the film to be pulled away and separated from the semiconductor chips. This will then enable the thus separated semiconductor chips to be raised by the suctioning collet, or any suitable lifting device, and to be transported for further processing.

2. Discussion of the Prior Art

Although these various devices, as presently used in the technology, effect the foregoing at different degrees of efficacy, these have not fully been successful in eliminating potential edge chipping or cracking of the semiconductor chips during separation from the underlying adhesive tapes or sheets, inasmuch as the semiconductor chips may still be subject to edge damaging due to the adhesive tape or sheet snapping back or tiling the chips during the separation or picking process.

Kurosuwa, U.S. Pat. No. 6,709,543 B2, discloses a semiconductor chip pickup device and pickup method, wherein a plurality of upstanding pin members, which are mounted on a chuck or jig located beneath an adhesive sheet or tape that has the semiconductor chips adhere to the upper surface thereof. During upward motion of the pin members, the adhesive sheet is displaced upwardly, while concurrently a vacuum or subatmospheric pressure is created beneath the adhesive sheet so as to assist in the pulling away and separation thereof from the superimposed semiconductor chips. In this publication, the pin member arrangement includes a plurality of somewhat shorter pins inwardly located of externally lengthier and higher extending in order pins to assist in the deflection of the adhesive sheet. Although this is generally deemed to be a workable chip picking apparatus and method, the shorter pins are constructed so as to be adjustable in height relative to the fixed lengthier pins, thereby considerably increasing the complexity and cost of the chip pickup device, while still not having deemed to provide a complete degree of control in the prevention of adhesive tape snapback which could conceivably damage the edges of the superimposed and being presently separated semiconductor chip.

Kurosawa, et al., U.S. Pat. No. 6,555,418 B2 disclose a method and apparatus for separating or picking up semiconductor chips or elements from an underlying adhesive sheet on which the semiconductor elements are adhesively positioned by means of a pushup device. The latter comprises pin members, which penetrate through openings in a vacuum device, in which a controlled vacuum is created to draw the adhesive sheet downwardly onto the pin member away from contact with the semiconductor chip, while the latter is raised by means of a vacuum collet structure.

Tawara, U.S. Pat. No. 6,386,815 B1 discloses a pickup apparatus for semiconductor chips wherein a cam structure permits for rotatable arrangement of a lower chuck member so as to be adjustable to differently sized semiconductor chips, which are to be picked up and separated from an underlying adhesive tape or film through the intermediary of differently sized and displaceable pins without having to replace a pin holder. This does not provide for any structure or method which will prevent adhesive tape or sheet snapback which would possibly have a tendency to cause edge cracking or chipping of the semiconductor chip while being separated or picked up from the underlying adhesive tape or sheet.

Finally, Matsui, et al., U.S. Pat. No. 5,589,029 discloses an arrangement for piercing through adhesive tape by means of upstanding displaceable pins so as to engage the bottom of a semiconductor chip, which is being upwardly drawn by means of a vacuum collet, while concurrently providing a sub-atmospheric or vacuum atmosphere below the adhesive tape to assist in drawing the latter downwardly into contact with a chuck below the collet, and aid in separating the adhesive sheet from the semiconductor chip. This type of structure would not, in effect, prevent any snapback of the adhesive sheet during separation from the semiconductor chip and may possibly lead to edge cracking or chipping of the chip as it is being picked or separated from the adhesive sheet.

SUMMARY OF THE INVENTION

Accordingly, pursuant to the present invention, there are provided advantageous methods and picking devices for separating semiconductor chips, which have been individualized from a wafer, during die picking process steps in separating the chips from an underlying adhesive sheet or tape on which they are positioned, which will prevent any snapback of the adhesive tape, thereby reducing the risk of damage to a semiconductor chip during separation from the underlying adhesive sheet, providing for an advantageous energy dispersal during the implementation thereof.

In order to facilitate the foregoing, pursuant to a first embodiment of the present invention, there is provided a chuck located below an adhesive sheet supporting semiconductor chips, which include a chuck structure incorporating an upwardly displaceable anvil having an upstanding pin arrangement, wherein a plurality of peripherally spaced pins include a slightly shorter center pin. Thus, upon the raising of the pin mounting anvil, the adhesive sheet, while the semiconductor chip thereabove is lifted upwardly therefrom, is contacted by the pins of the raised anvil, and deflected toward the shorter center pin dissipating and distributing energy so as to prevent any snapback of the adhesive tape which could have a tendency of potentially causing the semiconductor chip to tilt and cause edge chipping or cracking damage thereto during tape snapback.

Pursuant to a further aspect of the present invention, the anvil structure which mounts the upstanding pin arrangement, the latter of which do not penetrate through the adhesive sheet, unlike various embodiments of the prior art, the pins may each be of a hollow construction and have the interior passages thereof communicating with a source of vacuum whereby, concurrently with the anvil or the pin mounting structure being raised so as to engage the adhesive sheet, there is created a vacuum or sub-atmospheric conditions at the tips of the respective pins, which will cause the adhesive tape to be drawn downwardly into engagement therewith and further enhance the separating action between the adhesive sheet and the semiconductor chip, the latter of which may concurrently be lifted upwardly by means of a suitable lifting device, such as a vacuum collet. This will further enhance the prevention of any adhesive tape snapback during separation from the semiconductor chip and ensure that the semiconductor chip will not be subjected to potential edge chipping and cracking.

According to a further alternative aspect of the invention, the anvil structure mounting the upstanding pin arrangement is arranged and wherein the center pin may be somewhat shorter than the outer pins, rather than providing a vacuum interiorly of the pins, a positive pressure is created below the adhesive tape by means of a gas flow passage extending about the center pin providing for a flow of gases thereabout exerting an upward pressure, which will also enhance snapback of the adhesive tape superimposed on the pins during pickup or separation of the semiconductor chip from the upper surface of the tape, while producing a favorable energy disposition inhibiting any damage to the semiconductor chips.

The foregoing inventive structures clearly provide advantageous methods and devices in affording a separation between the semiconductor chips and underlying adhesive sheets or tapes during the die pick up process taking place, while clearly and unambiguously preventing any edge chipping and cracking damage being encountered by the semiconductor chip and also avoiding the necessity for piercing through the adhesive sheet by means of any pin arrangement.

Accordingly, it is an object of the present invention to provide an arrangement for picking up and separating the semiconductor chips from underlying adhesive tapes or sheets during a chip pickup process by means of a suitable movable anvil and pin arrangement underlying the adhesive tape that will prevent edge chipping and cracking damage being encountered to the semiconductor chips during this process.

Pursuant to a specific embodiment of the present invention, the underlying upstanding pins, which are movable towards the adhesive sheet are hollow and provided with central passageways communicating with a source of a vacuum in order to cause the adhesive tape to more closely adhere to the pin tips and thereby provide for an arrangement possessing an energy distribution which will inhibit the semiconductor chips being subjected to edge chipping or cracking during a picking process from the adhesive sheet.

Pursuant to another aspect of the invention, the pins may have the center pin encompassed by passageways for imparting a positive gas pressure thereabout so as to also enhance the capability of preventing snapback of the adhesive film at that point by bulging the adhesive sheet and assisting in the separation of the sheet from the semiconductor chip, as the latter is being picked and lifted away therefrom.

Another object of the present invention resides in providing diverse methods of preventing edge chipping and cracking damage being encountered by semiconductor chips during a process of being picked up from an underlying adhesive sheet through the intermediary of a novel inventive pin arrangement and anvil structure.

BRIEF DESCRIPTION OF THE DRAWINGS

Reference may now be made to the following detailed description of preferred embodiments of the invention, taken in conjunction with the accompanying drawings; in which:

FIG. 2 illustrates, generally diagrammatically, a side view of an anvil portion of a chuck structure mounting a novel upstanding pin arrangement utilized in connection with the device of FIGS. 1A and 1B;

FIG. 3 illustrates, generally diagrammatically, a top plan view of the anvil and pin arrangement of the chuck structure of FIG. 2;

FIG. 4 illustrates, generally diagrammatically, a side view of a modified arrangement of the anvil and upstanding pins, similar to FIGS. 1 and 2, but including hollow passageways formed in the pins enabling connection thereof to a source of vacuum; and FIG. 5 illustrates a modification of the anvil and pin arrangement of FIGS. 1 and 2, showing passageways encompassing or extending about the center pin, enabling the introduction of a positive flow of gases to the region of the adhesive tape or sheet which is being positioned thereabove.

DETAILED DESCRIPTION OF THE DRAWINGS

Figure 1A:
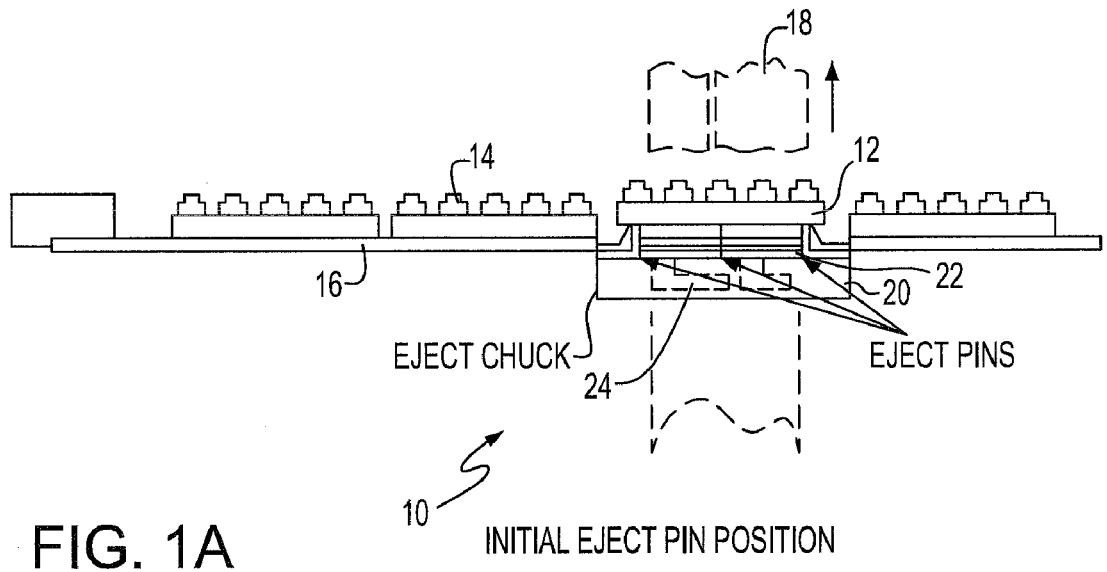
FIGS. 1A and 1B illustrate generally diagrammatically, respectively, first and second operating positions of an initial pin eject position and a final pin eject position in the pickup and separation of semiconductor chips from an underlying adhesive sheet or tape.

Referring now in detail to the drawings, particularly FIG. 1A, there is illustrated, generally diagrammatically, a device 10 for the picking up of semiconductor chips 12, which have been previously diced or separated from a wafer, and which may optionally mount suitable electronic components 14. The semiconductor chips 12 are adhesively fastened or mounted on an underlying adhesive sheet 16, which enables the fixed positioning thereon during the previous dicing process. The semiconductor chips 12, which have been separated or diced from the wafer, are then required to be picked up and separated from the underlying adhesive sheet 16 to which they are adhered, so as to facilitate further processing thereof for subsequent installation into suitable electronic or semiconductor packages or devices (not shown).

In order to facilitate the foregoing, arranged above the respective semiconductor chip, which is to be separated from the sheet, may be a suitable suctioning device or collet 18, which will raise the semiconductor chip 12 upwardly relative to the underlying adhesive sheet 16, and which does not form a part of the inventive aspects disclosed herein.

Figure 1B:
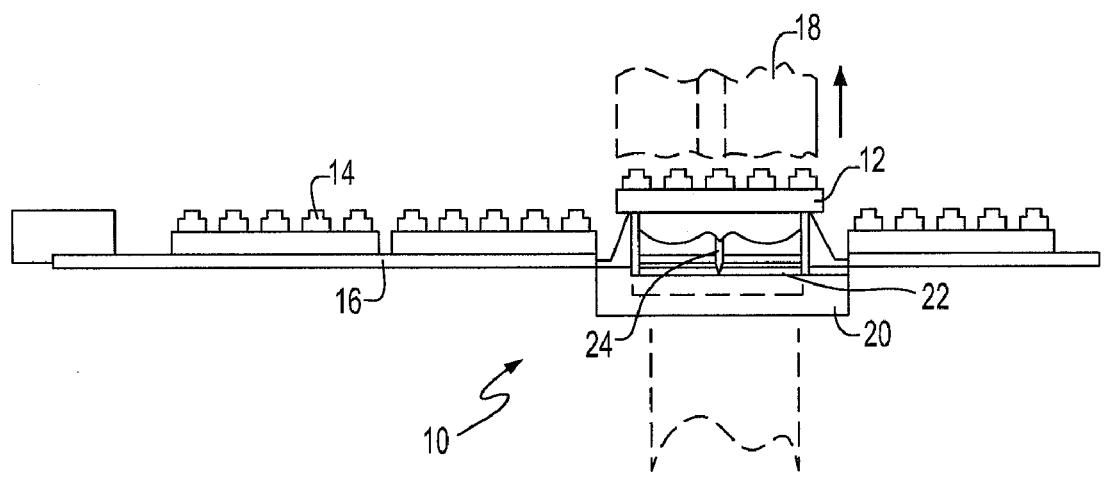

In order to effect the separation of the adhesive sheet 16 from the semiconductor chip 12, pursuant to the invention, provided is a suitable eject chuck 20 containing an upwardly actuatable anvil structure 22 having an upstanding pin member arrangement 24, which is adapted to contact the lower surface of the adhesive sheet 16. As shown in FIG. 1B of the drawings, as the semiconductor chip is raised upwardly by collet 18, the separation from the underlying adhesive sheet or tape 16 is effected while the sheet is engaged by the upstanding pin arrangement 24 by upward displacement of the anvil structure 22 having been raised relative to the initial lower position thereof. This is illustrated in the final eject pin position, as shown in FIG. 1B, showing the pins being raised towards the bottom surface of the semiconductor chip which, in the present instance, unlike various patents in the prior art, will not penetrate through the adhesive sheet.

However, in the prior art, as discussed hereinabove, the configurations of the pins may, at times, cause snapback of the adhesive sheet or tape 16 during separation from the semiconductor chips 12, which may tend to tilt the semiconductor chips or possibly cause other misalignment which may result in edge chipping and cracking of the semiconductor chip 12 during this step, so as to render the latter unusable for installation in a semiconductor device or electronic package.

In an improvement over the prior art, pursuant to a first embodiment of the invention, as represented by drawing FIGS. 2 and 3, the chuck 20, which is positioned beneath the adhesive sheet 16, has the anvil structure 22 possessing in the form of a plate or housing member 30 containing an array of upstanding pins 32, which each have rounded upper tips 34. A center pin 36 of the pin array 32 is somewhat shorter than the outer located pins 38 thereof; for example, being shorted in length by approximately 4 to 5 μm.

The somewhat shorter center pin, upon being raised into an eject or pick up position for a semiconductor chip 12 from the adhesive sheet 16, will enable the adhesive sheet or tape 16 to be located somewhat lower in the center part thereof, relative to the heights on the outer pins 38, thereby creating an energy dissipation preventing snapback energy of the adhesive sheet 16 from reaching the surrounding unpicked dies located about the semiconductor chip 12 being separated therefrom. This will inhibit any potential edge cracking or chipping of the picked or separated semiconductor chip to take place during this process sequence.

Pursuant to a somewhat modified embodiment, as illustrated in FIG. 4 of the drawings, wherein this illustrates a structure somewhat similar to that of FIGS. 2 and 3 and wherein similar or identical elements are identified with the same reference numerals, in this instance, the pins 36, 38 are each provided with internal channels 40 communicating with a plenum 42 in the anvil 22, which plenum 42, in turn, communicates with a source of a vacuum 44 that may be connected to a suitable control component 46 for regulating the vacuum cycle during operation. In this instance, the control component will enable during the pin ejection position (as in FIG. 1B) to exert a vacuum in the plenum 42 and up to the tips of the pins 36, 38 contacting the lower surface of the adhesive sheet 16, so as to cause the sheet to draw downwardly into contact with the tips of the pins and into the spaces 48 surrounding at least the shorter center pin 36, still further enhancing the energy dissipation and preventing snapback energy derived from the adhesive sheet 16 from reaching any surrounding unpicked dies or semiconductor chips.

Similarly, with respect to FIG. 5 of the drawings, which illustrate an embodiment similar to FIGS. 2 and 3, in this instance, the shorter center pin 36 is surrounded by passageways 50 or apertures connected to a pressure device which will provide a flow of positive gases to the spatial portion or region surrounding the shorter center pin, and which will again provide a condition preventing snapback of the adhesive sheet or tape 16 during the chip ejection or picking process during which the semiconductor chip is raised upwardly, thereby dissipating any snapback energy of the adhesive sheet 16 from reaching surrounding semiconductor chips or dies 12.

The foregoing embodiments each describe a somewhat different type of pin structure, including a shorter center pin 36, and the optional use of selective vacuum conditions extending through hollow ones of the pins, rather than thereabout when the pins are solid in construction, or a pressurized condition extending about the center pin, which will all aid in preventing snapback of the adhesive sheet or tape mounting the semiconductor chips and thereby clearly assisting in preventing edge chipping or cracking being encountered by the semiconductor chips 12 as they are being separated from and lifted away by being picked up from the adhesive sheet 16.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. A semiconductor chip pickup device for separating semiconductor chips from an underlying adhesive sheet to which said semiconductor chips are removably adhered, said device comprising:

a structure for supporting said adhesive sheet in a generally layflat condition;

a semiconductor chip ejecting chuck being arranged below said layflat adhesive sheet supporting structure;

said chip ejecting chuck including a housing having a vertically displaceable anvil arranged therein, said anvil mounting an array of upstanding pin members in mutually spaced relationships, a center pin member of said pin member array being shorter than the remaining pin members and being fixed relative thereto, said anvil upon being upwardly displaced causing said pin members to exert a deflective action on said adhesive sheet producing a separation of a semiconductor chip located thereabove from said adhesive sheet, whereby said array of pin members concurrently inhibit any snapback energy from reaching surrounding unpicked semiconductor chip and preventing damage to said picked up semiconductor chip; and each of said pin members being hollow to form a passageway between the tip of each pin member and a vacuum generating source, wherein upon said anvil raising said pin members into contact with said adhesive sheet, a vacuum generated in each said pin member causes said adhesive sheet to adhere to the tips of said pin members and assist in preventing snapback of said adhesive sheet.

2. A device as claimed in claim 1, wherein said center pin member of said pin member array is shorter by about 4 to 5 μm than the remaining pin members on said anvil.

3. A device as claimed in claim 1, wherein said chip ejecting chuck has the interior thereof subjected to a vacuum encompassing said pin member array enhancing the aspiration of said adhesive sheet towards said pin members and assisting the separation of the semiconductor chip from said adhesive sheet.

4. A device as claimed in claim 3, wherein a control unit regulates the vacuum which is supplied to the interior of said chip eject chuck.

5. A device as claimed in claim 1, wherein a control unit regulates the vacuum which is present in the passageway in each of said pin members.

6. A device as claimed in claim 1, wherein a channel is formed in said anvil about said center pin member, said channel communicating with a pressure-generating source to produce a pressurized atmosphere about at least said shorter center pin member upon said pin member array being raised into contact with said adhesive sheet.

7. A device as claimed in claim 6, wherein said pressurized atmosphere is produced by a gaseous medium.

8. A device as claimed in claim 7, wherein said gaseous medium is constituted of air or an inert gas.

9. A device as claimed in claim 7, wherein a control unit regulates the supply of said pressurized medium to the interior of said chip eject chuck about said shorter center pin members.

10. A method of separating semiconductor chips from an underlying adhesive sheet to which said semiconductor chips are removably adhered, said device comprising:

supporting said adhesive sheet in a generally layflat condition;

arranging a semiconductor chip ejecting chuck being arranged below said layflat adhesive sheet supporting structure;

said chip ejecting chuck including a housing having a vertically displaceable anvil arranged therein, said anvil mounting an array of upstanding pin members in mutually spaced relationships, a center pin member of said pin member array being shorter than the remaining pin members and being fixed relative thereto, said anvil upon being upwardly displaced causing said pin members to exert a deflective action on said adhesive sheet producing a separation of a semiconductor chip located thereabove from said adhesive sheet, whereby said array of pin members concurrently inhibit any snapback energy from reaching surrounding unpicked semiconductor chip and preventing damage to said picked up semiconductor chip; and each of said pin members being hollow forming a passageway between the tip of each pin member and a vacuum generating source, wherein upon said anvil raising said pin members into contract with said adhesive sheet, a vacuum generated in each said pin member causes said adhesive sheet to adhere to the tips of said pin members and assist in preventing snapback of said adhesive sheet.

11. A method as claimed in claim 10, wherein said center pin member of said pin member array is shorter by about 4 to 5 μm than the remaining pin members on said anvil.

12. A method as claimed in claim 10, wherein said chip ejecting chuck has the interior thereof subjected to a vacuum encompassing said pin member array enhancing the aspiration of said adhesive sheet towards said pin members and assisting the separation of the semiconductor chip from said adhesive sheet.

13. A method as claimed in claim 12, wherein a control unit regulates the vacuum which is supplied to the interior of said chip eject chuck.

14. A method as claimed in claim 10, wherein a control unit regulates the vacuum which is present in the passageway in each of said pin members.

15. A method as claimed in claim 10, wherein a channel is formed in said anvil about said center pin member, said channel communicating with a pressure-generating source to produce a pressurized atmosphere about at least said shorter center pin member upon said pin member array being raised into contact with said adhesive sheet.

16. A method as claimed in claim 15, wherein said pressurized atmosphere is produced by a gaseous medium.

17. A method as claimed in claim 16, wherein said gaseous medium is constituted of air or an inert gas.

18. A method as claimed in claim 16, wherein a control unit regulates the supply of said pressurized medium to the interior of said chip eject chuck about said shorter center pin members.

* * * * *